US011238911B2

(12) United States Patent
Ying et al.

(10) Patent No.: US 11,238,911 B2
(45) Date of Patent: Feb. 1, 2022

(54) METHOD FOR WRITING TO MAGNETIC RANDOM ACCESS MEMORY

(71) Applicant: TAIWAN SEMICONDUCTOR MANUFACTURING CO., LTD., Hsinchu (TW)

(72) Inventors: Ji-Feng Ying, Hsinchu (TW); Jhong-Sheng Wang, Taichung (TW); Baohua Niu, Portland, OR (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/902,134

(22) Filed: Jun. 15, 2020

(65) Prior Publication Data

US 2020/0312393 A1 Oct. 1, 2020

Related U.S. Application Data

(63) Continuation of application No. 16/377,036, filed on Apr. 5, 2019, now Pat. No. 10,685,693.
(Continued)

(51) Int. Cl.
*G11C 11/00* (2006.01)
*G11C 11/16* (2006.01)
(52) U.S. Cl.
CPC ........ *G11C 11/161* (2013.01); *G11C 11/1673* (2013.01); *G11C 11/1675* (2013.01)
(58) Field of Classification Search
CPC . G11C 11/161; G11C 11/1673; G11C 13/004; G11C 11/15; G11C 11/16;
(Continued)

(56) References Cited

U.S. PATENT DOCUMENTS 8,169,816 B2 5/2012 Min et al.
2011/0063900 A1 3/2011 Shimizu et al.
(Continued)

FOREIGN PATENT DOCUMENTS

CN 1856836 A 11/2006
JP 2011-187145 A 9/2011
(Continued)

OTHER PUBLICATIONS

Notice of Allowance issued in U.S. Appl. No. 16/377,036, dated Feb. 3, 2020.

*Primary Examiner* — Thong Q Le
(74) *Attorney, Agent, or Firm* — McDermott Will & Emery LLP

(57) ABSTRACT

A method of manufacturing an array of magnetic random access memory cells includes writing to a magnetic random access memory cell. The writing to a memory cell includes determining an optimum write current for the array of memory cells, and applying the optimum write current to a first memory cell in the array. A first read current is applied to the first memory cell to determine whether a magnetic orientation of the first memory cell has changed in response to applying the optimum write current. A second write current is applied to the first memory cell when the magnetic orientation of the first memory cell has not changed. The second write current is different from the optimum write current. A second read current is applied to the first memory cell to determine whether the magnetic orientation of the first memory cell changed in response to applying the second write current.

20 Claims, 14 Drawing Sheets

Related U.S. Application Data

(60) Provisional application No. 62/698,565, filed on Jul. 16, 2018.

(58) Field of Classification Search
CPC ............ G11C 11/1659; G11C 11/1675; G11C 11/1693; G11C 13/0002; G11C 13/0064; G11C 13/0069; G11C 2013/0042; G11C 2013/0054; G11C 2013/0066; G11C 5/06
See application file for complete search history.

(56) References Cited

U.S. PATENT DOCUMENTS

| | | |
|---|---|---|
| 2012/0243329 A1 | 9/2012 | Nagashima |
| 2014/0063896 A1 | 3/2014 | Ahn |
| 2019/0006022 A1 | 1/2019 | Niu et al. |
| 2019/0206465 A1* | 7/2019 | Bozdag ............... G11C 11/1675 |

FOREIGN PATENT DOCUMENTS

| | | |
|---|---|---|
| JP | 2012-203692 A | 10/2012 |
| KR | 10-2014-0029814 A | 3/2014 |

\* cited by examiner

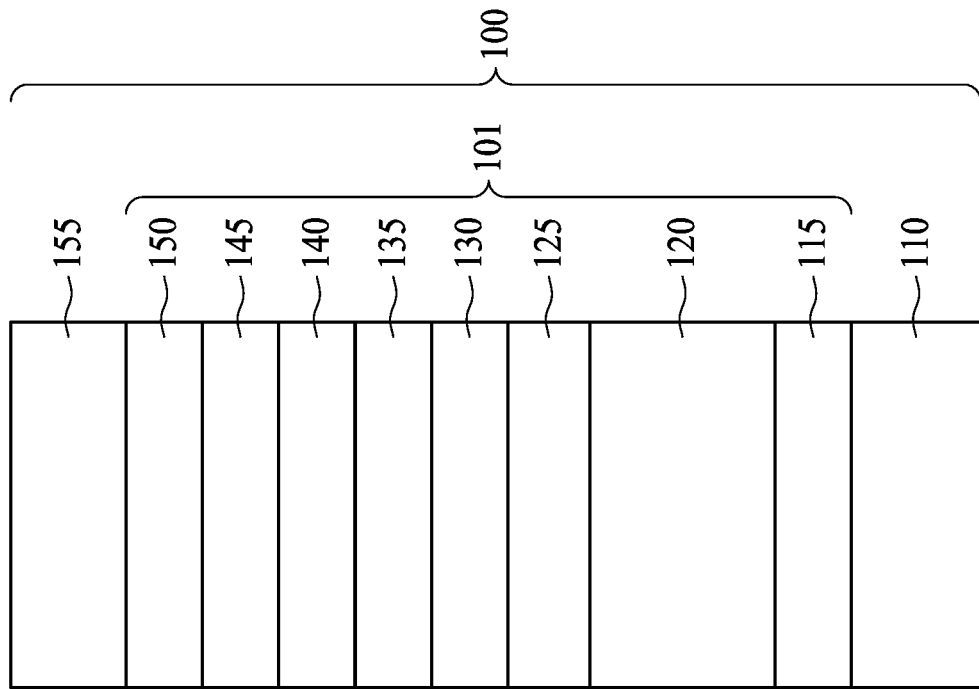
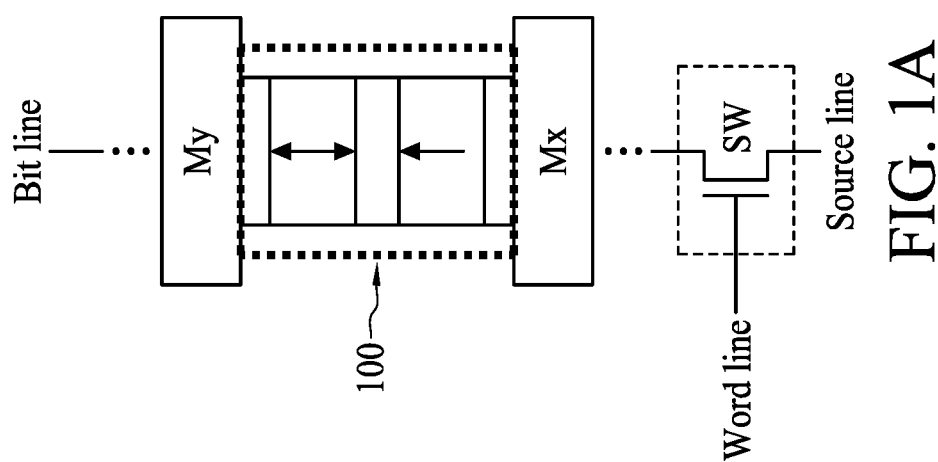

METHOD FOR WRITING TO MAGNETIC RANDOM ACCESS MEMORY

CROSS-REFERENCE TO RELATED APPLICATIONS

This application is a Continuation of U.S. application Ser. No. 16/377,036, filed Apr. 5, 2019, now U.S. Pat. No. 10,685,693, which claims priority to U.S. Provisional Patent Application No. 62/698,565, filed Jul. 16, 2018, the entire disclosures of which are incorporated herein by reference.

BACKGROUND

A magnetic random access memory (MRAM) offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. An MRAM cell is formed by a magnetic tunneling junction (MTJ) comprising two ferromagnetic layers that are separated by a thin insulating barrier, and operates by tunneling of electrons between the two ferromagnetic layers through the insulating barrier.

BRIEF DESCRIPTION OF THE DRAWINGS

FIG. 1A is a schematic view of a MTJ MRAM cell according to an embodiment of the present disclosure.

FIG. 1B is a schematic cross sectional view of the MTJ film stack according to an embodiment of the present disclosure.

DETAILED DESCRIPTION

Figure 2A:
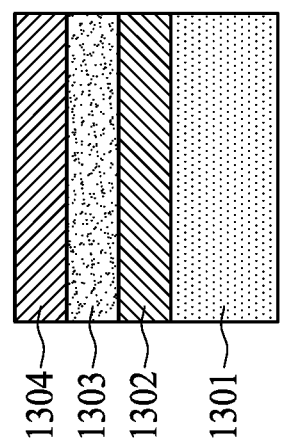
FIGS. 2A, 2B, and 2C show schematic cross sectional views of magnetic layers of the MTJ film stack according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

The MRAM cells include a film stack of multiple layers including magnetic layers. In some MRAM devices, depending on the magnetic design, one or more non-magnetic spacer layers may need to be inserted between magnetic layers to optimize the magnetic interaction. In some embodiments, one or more diffusion barrier layers may be inserted into the film stack to minimize adverse diffusion phenomenon. Further, in the MTJ MRAM cells, other than the tunneling barrier layer, every layer within the film stack needs to be conductive to maximize a read/write window.

Material for a seed layer, a spacer layer and/or a diffusion barrier layer is appropriately selected in some embodiments to provide a desired specific crystalline structure and orientation, and does not disrupt the magnetic interactions of the functional layers. Further, the seed layer, the spacer layer and the diffusion barrier layer should be smooth, non-orientation specific (amorphous), conductive and non-magnetic.

The magnetic tunneling function of the MTJ MRAM cells depends on a specific crystalline structure and an orientation of the MTJ films. In order to have the desired crystalline structure and orientation in the MTJ films, the whole film stack needs to be grown on a smooth, amorphous, conductive, non-magnetic seed layer. Among various materials, tantalum (Ta) is the most widely used as the seed layer, which can be easily grown as a smooth and amorphous layer. Further, a non-magnetic spacer layer, such as molybdenum (Mo), is often used in the MTJ films. Other than tantalum (Ta) and molybdenum (Mo), cobalt (Co), platinum (Pt), iridium (Ir), and/or nickel (Ni) may be used as a seed layer or a spacer layer.

The crystalline magnetic layers are grown from the crystalline lattice of the MgO layer, or the crystalline magnetic layers use the crystalline lattice as a growth template.

FIG. 1A is a schematic view of a MTJ MRAM cell according to an embodiment of the present disclosure. The MTJ film stack 100 is disposed between a lower metal layer Mx and an upper metal layer My of a semiconductor device. The metal layers Mx and My are used to connect one element to another element in a semiconductor device formed at a different level above a substrate. Further, the lower metal layer Mx is coupled to a switching device SW, which can be formed by a MOS FET including, but not limited to, a planar MOS FET, a fin FET, a gate-all-around (GAA) FET, or any other switching devices. A control terminal (e.g., a gate terminal of FET) of the switching device is coupled to a word line. One of the terminals of the switching device SW is coupled to the lower metal layer Mx and the other terminal is coupled to the source line, which is a fixed potential (e.g., the ground) in some embodiments. The upper metal layer My is coupled to a bit line. In some embodiments, the switching device SW is disposed between the upper metal layer My and the bit line.

The MTJ film stack 100 includes a first electrode layer 110 coupled to the lower metal layer Mx and a second electrode layer 155 coupled to the upper metal layer My. An MTJ functional layer 101 is disposed between the first electrode layer 110 and the second electrode layer 155, as shown in FIG. 1B.

The MTJ functional layer 101 includes a second pinned magnetic layer 130, a free magnetic layer 140, and a tunneling barrier layer 135 made of a non-magnetic material and disposed between the second pinned magnetic layer 130 and the free magnetic layer 140. The free magnetic layer 140 and the second pinned magnetic layer 130 include one or more ferromagnetic materials that can be magnetically oriented, respectively. The free magnetic layer 140 is configured such that the magnetic orientation can be changed, or rotated, by exposure to an external magnetic field. The second pinned magnetic layer 130 is configured such that the magnetic orientation is fixed and will not respond to a typical magnetic field. In some embodiments, the thickness of the free magnetic layer 140 is in a range from about 0.8 nm to about 1.5 nm. In some embodiments, the thickness of the second pinned layer 130 is in a range from about 0.8 nm to about 2.0 nm.

The tunneling barrier layer 135 includes a relatively thin oxide layer capable of electrically isolating the free magnetic layer 140 from the second pinned magnetic layer 130 at low potentials and capable of conducting current through electron tunneling at higher potentials. In some embodiments, the tunneling barrier layer 135 is made of magnesium oxide (MgO) having a thickness in a range from about 0.5 nm to about 1.2 nm.

In some embodiments, the MTJ functional layer 101 further includes an antiferromagnetic layer 125, as shown in FIG. 1B. The anti-ferromagnetic layer 125 is used to fix the magnetic orientation of the second pinned magnetic layer 130. The antiferromagnetic layer 125 includes ruthenium (Ru) or any other suitable antiferromagnetic material. In some embodiments, the thickness of the antiferromagnetic layer 125 is in a range from about 0.4 nm to about 1.0 nm.

The MTJ functional layer 101 further includes a first pinned magnetic layer 120 including one or more magnetic materials, as shown in FIG. 1B.

The second pinned magnetic layer 130 includes multiple layers of magnetic materials. In some embodiments, as shown in FIG. 2A, the second pinned magnetic layer 130 includes four layers 1301, 1302, 1303 and 1304, where layer 1304 is in contact with the tunneling barrier layer 135 and layer 1301 is in contact with the antiferromagnetic layer 125. In some embodiments, layer 1301 (the bottommost layer) includes a layer of Co. In some embodiments, a thickness of the cobalt layer is in a range from about 0.4 nm to about 0.6 nm. In some embodiments, layer 1302 includes a multilayer structure of cobalt (Co) and platinum (Pt). The thickness of the cobalt layer is in a range of about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of layer 1302 is in a range from about 2.0 nm to about 5.0 nm in some embodiments. In certain embodiments, layer 1301 is the cobalt layer and layer 1302 is the multilayer of the cobalt layers and the platinum layers as set forth above. In this disclosure, an "element" layer generally means that the content of the "element" is more than 99 atomic %.

Layer 1303 is a spacer layer. In some embodiments, the spacer layer includes Ta, Mo, Co, Pt, Ir, and/or Ni. The thickness of the spacer layer 1303 is in a range from about 0.2 nm to about 0.5 nm in some embodiments. The layer 1304 is a cobalt iron boron (CoFeB) layer, a cobalt/palladium (CoPd) layer and/or a cobalt iron (CoFe) layer. The thickness of the layer 1304 is in a range from about 0.8 nm to about 1.5 nm in some embodiments.

Figure 2B:
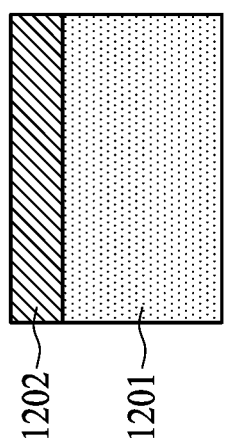

The first pinned magnetic layer 120 includes multiple layers of magnetic materials. In some embodiments, as shown in FIG. 2B, the first pinned magnetic layer 120 includes two layers 1201 and 1202, where layer 1202 is in contact with the antiferromagnetic layer 125. In some embodiments, layer 1201 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1201 is in a range from about 5.0 nm to about 10.0 nm in some embodiments. The layer 1202 includes a cobalt layer having a thickness in a range from about 0.4 nm to about 0.6 nm in some embodiments.

Figure 2C:
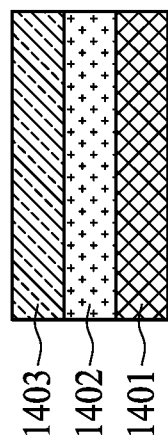

The free magnetic layer 140 includes a cobalt iron boron (CoFeB) layer, a cobalt/palladium (CoPd) layer and/or a cobalt iron (CoFe) layer having a thickness in a range from about 1.0 nm to about 2.0 nm in some embodiments. In other embodiments, the free magnetic layer 140 includes multiple layers of magnetic materials. In some embodiments, as shown in FIG. 2C, the free magnetic layer 140 includes three layers 1401, 1402 and 1403, where the layer 1401 is in contact with the tunneling barrier layer 135. Layers 1401 and 1403 are a cobalt iron boron (CoFeB) layer, a cobalt/palladium (CoPd) layer and/or a cobalt iron (CoFe) layer having a thickness in a range from about 1.0 nm to about 2.0 nm in some embodiments. The layer 1402 is a spacer layer. In some embodiments, the spacer layer includes Ta, Mo, Co, Pt, Ir, and/or Ni. The thickness of the spacer layer 1402 is in a range from about 0.2 nm to about 0.6 nm in some embodiments.

In some embodiments, the MTJ functional layer 101 further includes a seed layer 115 formed on the first electrode layer 110, a capping layer 145 formed on the free magnetic layer 140, and a diffusion barrier layer 150 formed on the capping layer 145, as shown in FIG. 1B. The capping layer 145 is made of a dielectric material, such as magnesium oxide or aluminum oxide, and has a thickness in a range from about 0.5 nm to about 1.5 nm in some embodiments. The first electrode layer 110 is made of a conductive material, such as a metal, to reduce the resistance of the first pinned magnetic layer 120, especially for programming. The second electrode layer 155 is also made of a conductive material, such as a metal, to reduce the resistivity during reading.

In some embodiments, the seed layer 115 includes a Pt layer and or Pt layer and a Ta layer. The seed layer 115 is for a growth of the first pinned magnetic layer 120, and generally has a smooth surface morphology, a high electric conductivity, and is substantially free of diffusion into the pinned magnetic layer 120. The thickness of the seed layer 115 is in a range from about 0.5 nm to about 20 nm in some embodiments, and is in a range from about 1.0 nm to about 10 nm in other embodiments. The seed layer 115 is amorphous in some embodiments.

In some embodiments, the diffusion barrier layer 150 includes a tantalum layer and/or a binary alloy layer of iridium and tantalum. The diffusion barrier layer for the MTJ film stack generally has a super smooth surface morphology, a high electric conductivity, and is substantially effective in alleviating diffusion issues. Further, the diffusion barrier layer should also be tolerant to a low level of oxidation without significant conductivity degradation. The thickness of the diffusion barrier layer 150 is in a range from about 0.1 nm to about 10 nm in some embodiments, and is in a range from about 0.5 nm to about 5.0 nm in other embodiments.

In some embodiments, the spacer layer 1303 and/or the spacer layer 1402 include an iridium layer and/or a binary alloy layer of iridium and tantalum. A spacer layer for the MTJ film stack is generally required to have a super smooth surface morphology and a high electric conductivity and to be substantially free from a diffusion issue. Further, the spacer layer should also be tolerant to a low level of oxidation without significant degradation of its conductivity. The thickness of the spacer layers 1303 and/or 1402 is in a range from about 0.1 nm to about 10 nm in some embodiments, and is in a range from about 0.5 nm to about 5.0 nm in other embodiments.

In some embodiments, the first electrode layer 110 is formed on the lower metal layer Mx made of, for example, Cu, Al, W, Co, Ni, and/or an alloy thereof; and the upper metal layer My made of, for example, Cu, Al, W, Co, Ni, and/or an alloy thereof, and is formed on the second electrode layer 155.

The pinned magnetic layer, the free magnetic layer, the antiferromagnetic layer, and the spacer/barrier layer can be formed by CVD, PVD or ALD or any other suitable film deposition method. The tunneling barrier layer can also be formed by CVD, PVD or ALD or any other suitable film deposition method. The first and second electrode layers can also be formed by CVD, PVD, ALD, or electro plating, or any other suitable film deposition method.

In some embodiments, the first electrode layer 110 is formed on the lower metal layer Mx, which has been patterned, the seed layer 115 is formed on the first electrode layer 110, the first pinned magnetic layer 120 is formed on the seed layer 115, the antiferromagnetic layer 125 is formed on the first pinned magnetic layer 120, the second pinned magnetic layer 130 is formed on the antiferromagnetic layer 125, the tunneling barrier layer 135 is formed on the second pinned magnetic layer 130, the free magnetic layer 140 is formed on the tunneling barrier layer 135, the capping layer 145 is formed on the free magnetic layer 140, the diffusion barrier layer 150 is formed on the capping layer 145, and the second electrode layer 155 is formed on the diffusion layer 150. One or more lithography and etching operations are performed to pattern the stacked layer into the MTJ film stack for each memory cell. In other embodiments, trenches for memory cells are formed in a dielectric layer and the MTJ film is formed in the trenches.

In some embodiments, the MRAM cells are formed over a dielectric material disposed over the substrate. In some embodiments, the substrate includes silicon (Si) and/or silicon oxide or other suitable semiconductor material. Transistors, driver circuits, logic circuits or any other electronic devices are formed by semiconductor materials and integrated with the MRAM cells.

FIGS. 3A-3D show a memory operation of MTJ cell. As shown in FIGS. 3A-3D, the MTJ cell includes a pinned magnetic layer 10, a tunneling barrier layer 15 and a free magnetic layer 20. The pinned magnetic layer 10 corresponds to the second pinned magnetic layer 130 or the combination of the first pinned magnetic layer 120, the antiferromagnetic layer 125 and the second pinned magnetic layer 130 of FIG. 1B. The tunneling barrier layer 15 corresponds to the tunneling barrier layer 135 of FIG. 1B and the free magnetic layer 20 corresponds to the free magnetic layer 140 of FIG. 1B. In FIGS. 3A-3D, the remaining layers are omitted. A current source 30 is coupled to the MTJ structure in series.

Figure 3D:
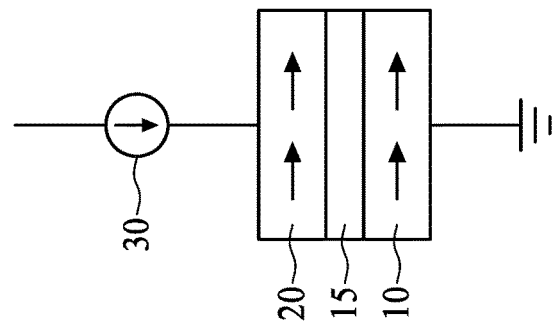
FIGS. 3C and 3D show a memory operation of MTJ cell.
Figure 3C:
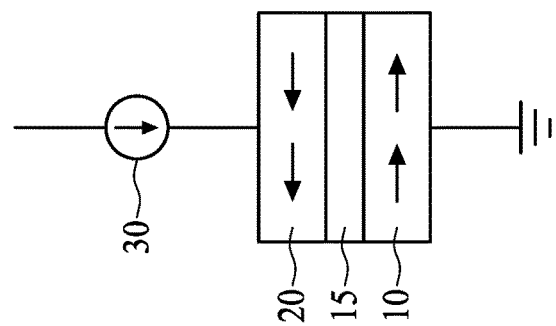
Figure 3B:
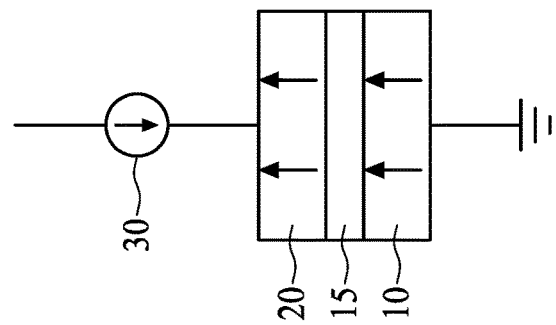
FIGS. 3A and 3B show a memory operation of MTJ cell.
Figure 3A:
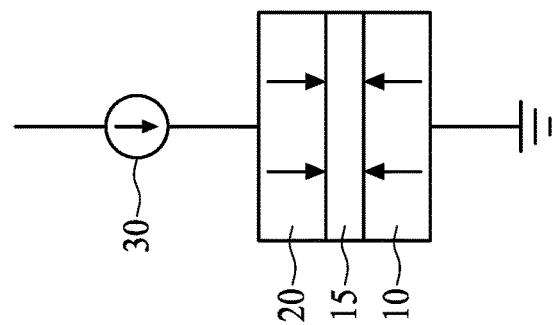

In FIG. 3A, the pinned magnetic layer 10 and the free magnetic layer 20 are magnetically oriented in opposite directions. In some embodiments, the spin directions of the pinned magnetic layer 10 and the free magnetic layer 20 are parallel to the film stack direction (perpendicular to the surface of the films). In FIG. 3B, the pinned magnetic layer 10 and the free magnetic layer 20 are magnetically oriented in the same direction. In other embodiments, the spin directions of the pinned magnetic layer 10 and the free magnetic layer 20 are perpendicular to the film stack direction (parallel with the surface of the films), as shown in FIGS. 3C and 3D. In FIG. 3C, the pinned magnetic layer 10 and the free magnetic layer 20 are magnetically oriented in opposite directions, while in FIG. 3D, the pinned magnetic layer 10 and the free magnetic layer 20 are magnetically oriented in the same direction.

If the same current value $I_C$ is forced to flow through the MTJ cell by the current source 30, it is found that the cell voltage $V_1$ in the case of FIG. 3A (or FIG. 3C) is larger than the cell voltage $V_2$ in the case of FIG. 3B (or FIG. 3D), because the resistance of an opposite-oriented MTJ cell shown in FIG. 3A (or FIG. 3C) is greater than the resistance of a same-oriented MTJ cell shown in FIG. 3B (or FIG. 3D). Binary logic data ("0" and "1") can be stored in a MTJ cell and retrieved based on the cell orientation and resulting resistance. Further, since the stored data does not require a storage energy source, the cell is non-volatile.

Figure 4:
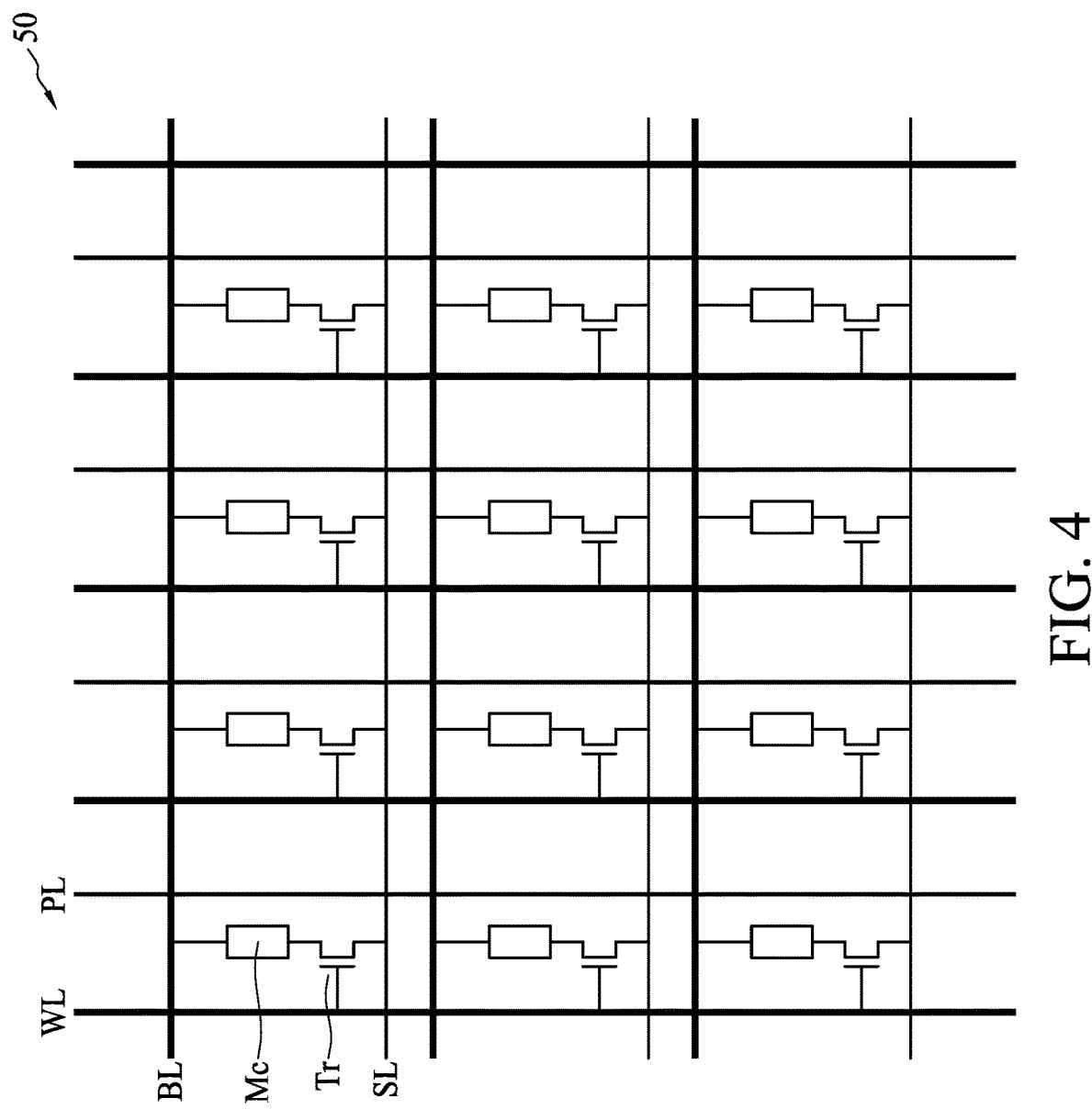
FIG. 4 shows an MRAM array.

FIG. 4 shows an MRAM array 50. Each memory cell includes a MTJ cell Mc and a transistor Tr, such as a MOS FET. The gate of the transistor Tr is coupled to a word line WL and a drain (or a source) of the transistor Tr is coupled to one end of the MTJ cell Mc, and another end of the MTJ cell is coupled to a bit line BL. Further, a signal line PL for programming is provided adjacent to the MTJ cells.

A memory cell is read by asserting the word line of that cell, forcing a reading current through the bit line BL of that cell, and then measuring the voltage on that bit line BL. For example, to read the state of a target MTJ cell, the word line WL is asserted to turn ON the transistor Tr. The free magnetic layer of the target MTJ cell is thereby coupled to the fixed potential SL, e.g., the ground through the transistor Tr. Next, the reading current is forced on the bit line BL. Since only the given reading transistor Tr is turned ON, the reading current flows through the target MTJ cell to the ground. The voltage of the bit line BL then measured to determine the state ("0" or "1") of the target MTJ cell. In some embodiments, as shown in FIG. 4, each MTJ cell has one reading transistor Tr. Therefore, this type of MRAM architecture is called 1T1R. In other embodiments, two transistors are assigned to one MTJ cell, forming a 2T1R system. Other cell array configurations can be employed.

Current MRAM testing and their field applications (eM-RAM, cache, DRAM, and flash replacement) use a constant bias (voltage or current) condition during write/read testing and field applications. Because of the high sensitivity of the MRAM stacks to inherent process variations, large die-to-die variation across the wafer, block-to-block variation across the die, and bit-to-bit variation across the block are observed. Different dies (on different wafer locations, e.g. center die vs edge die), different blocks and individual bits of MRAM cells very often have significantly different write/read windows and fail the test of write/read window/margin at a very high rate if a constant write/read bias is used (note that for a large array of MRAM that can be of practical usage hundreds of megabytes (MB) to gigabytes (GB), the die-chip could be as large as the full reticle field at 22 mm×32 mm). A whole-wafer population-averaged constant write/read window is too narrow to be practical and is close to un-usable for manufacturing, testing, and field application if not corrected. There is a need for improvement of the write operation because significant "optimum write current" differences are often observed on bits within a small array.

A hopping algorithm (in contrast to a constant write current) is employed in the execution of each write command, to further reduce the write failure rate in operations and improve yield in embodiments of the present disclosure.

In the first step of the functional test, the "hopping" mode in the write algorithm will be turned off in some embodiments. In this step, an adjusted and optimized write/read current will be found and set, based on the test result on a particular cell population.

Figure 5A:
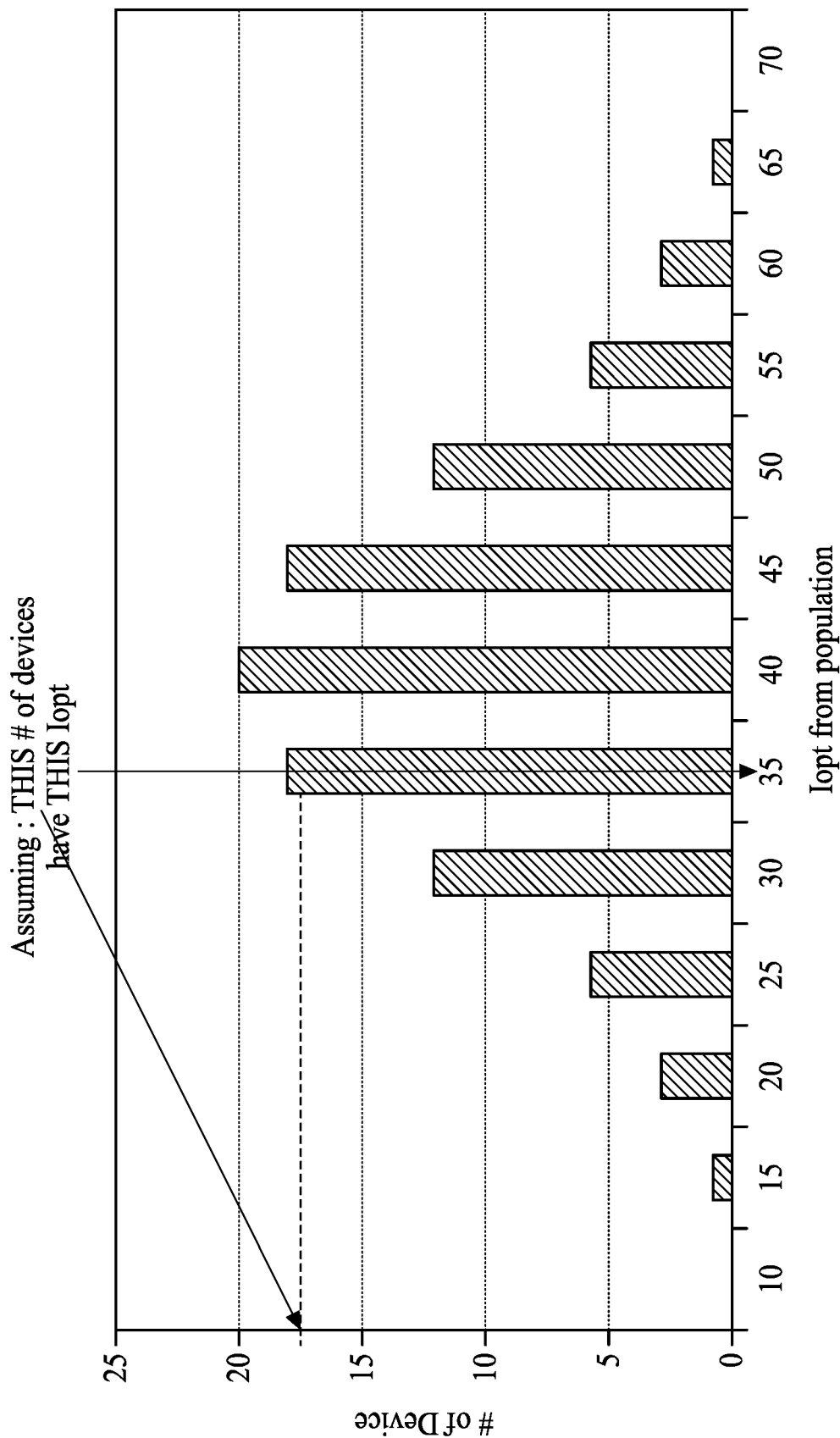
FIG. 5A shows the optimal write current distribution for an array of magnetic random access memory cells.
Figure 5B:
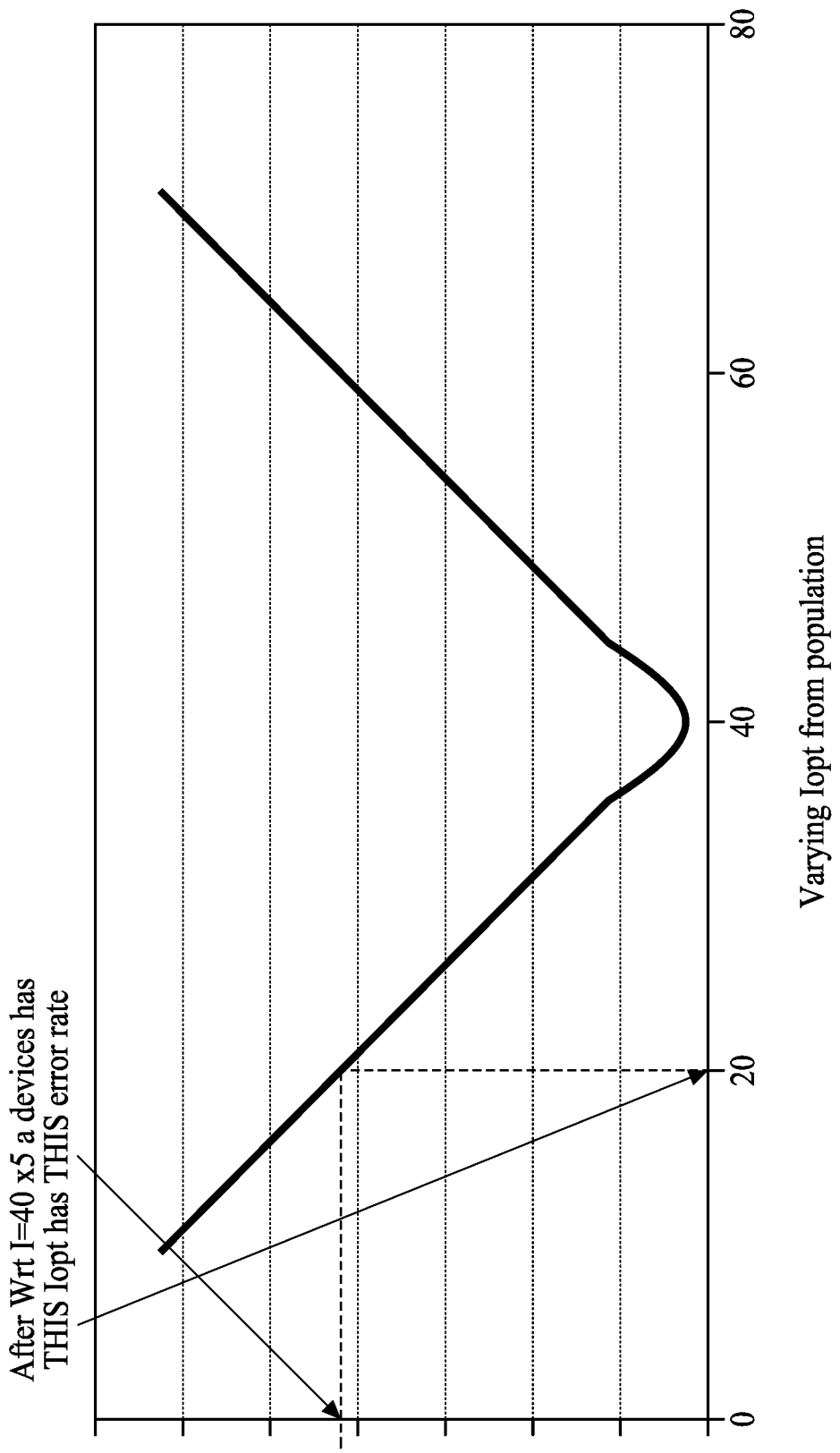
FIG. 5B shows the error rate of an array of magnetic random access memory cells at different write currents.

Each MRAM cell has an optimum write current (Iopt). The optimum write current for the MRAM cells in an array varies in accordance with a Gaussian distribution, as shown in FIG. 5A. In this embodiment, the Iopt is given in units of μA. When the write current deviates from the optimum write current, the error rate may increase exponentially. Because the optimum write current for a given magnetic random access memory cell may significantly deviate from the optimum write current for the array, applying the optimum write current for the array may not cause the magnetic orientation of the given magnetic random access memory cell to change. Therefore, the application of the write current may be applied multiple times in attempt to change the magnetic orientation. As shown in FIG. 5B, repeating the application of write current five times provides an error rate where the given memory cell does not change orientation. The Y-axis in the graph shown in FIG. 5B is logarithmic, and the X-axis is in units of μA. Thus, it is readily apparent that a slight change in Iopt causes a big difference in the error rate.

Figure 5C:
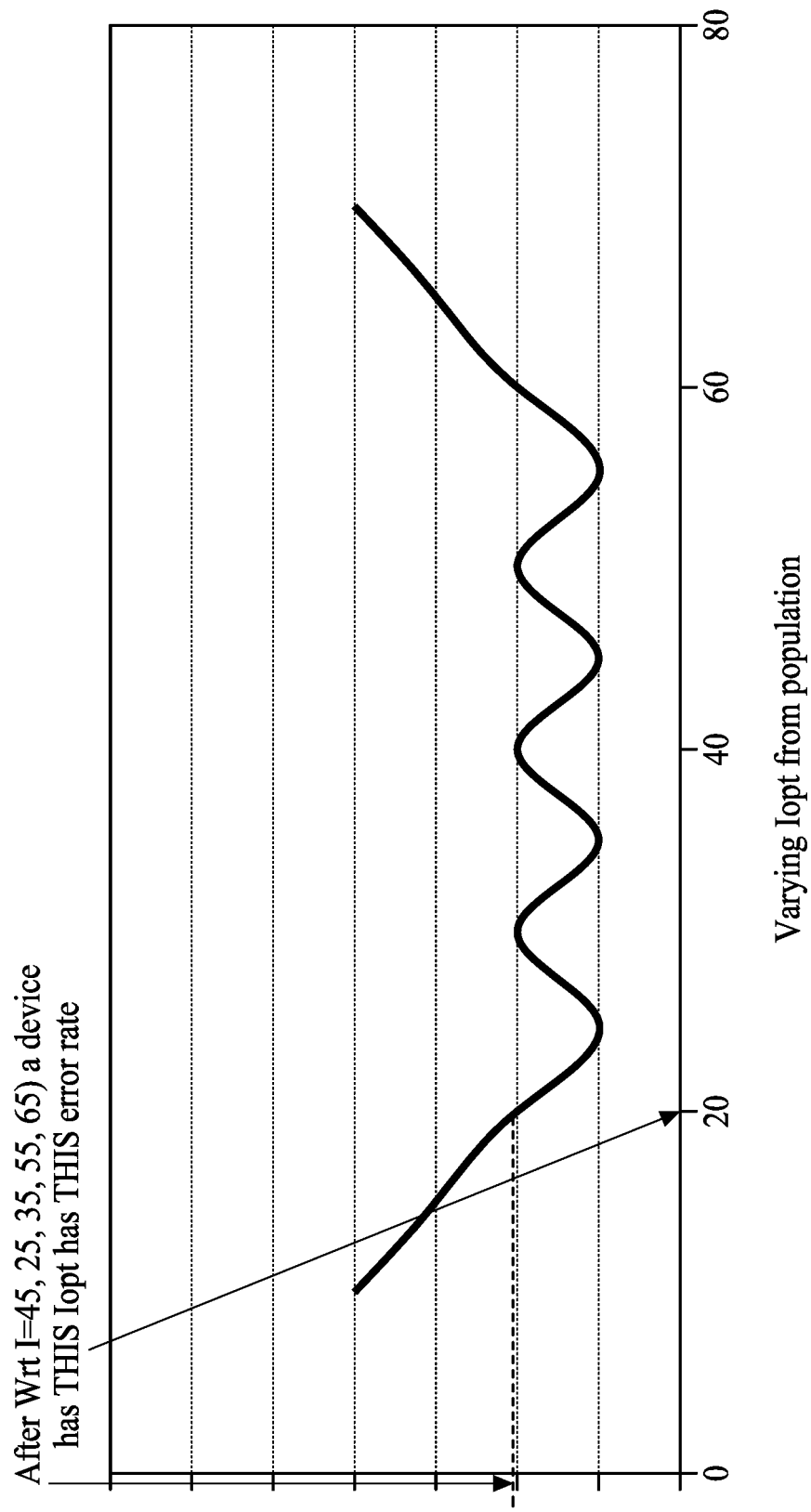
FIG. 5C shows the error rate of an array of magnetic random access memory cells at hopping write currents.
Figure 5D:
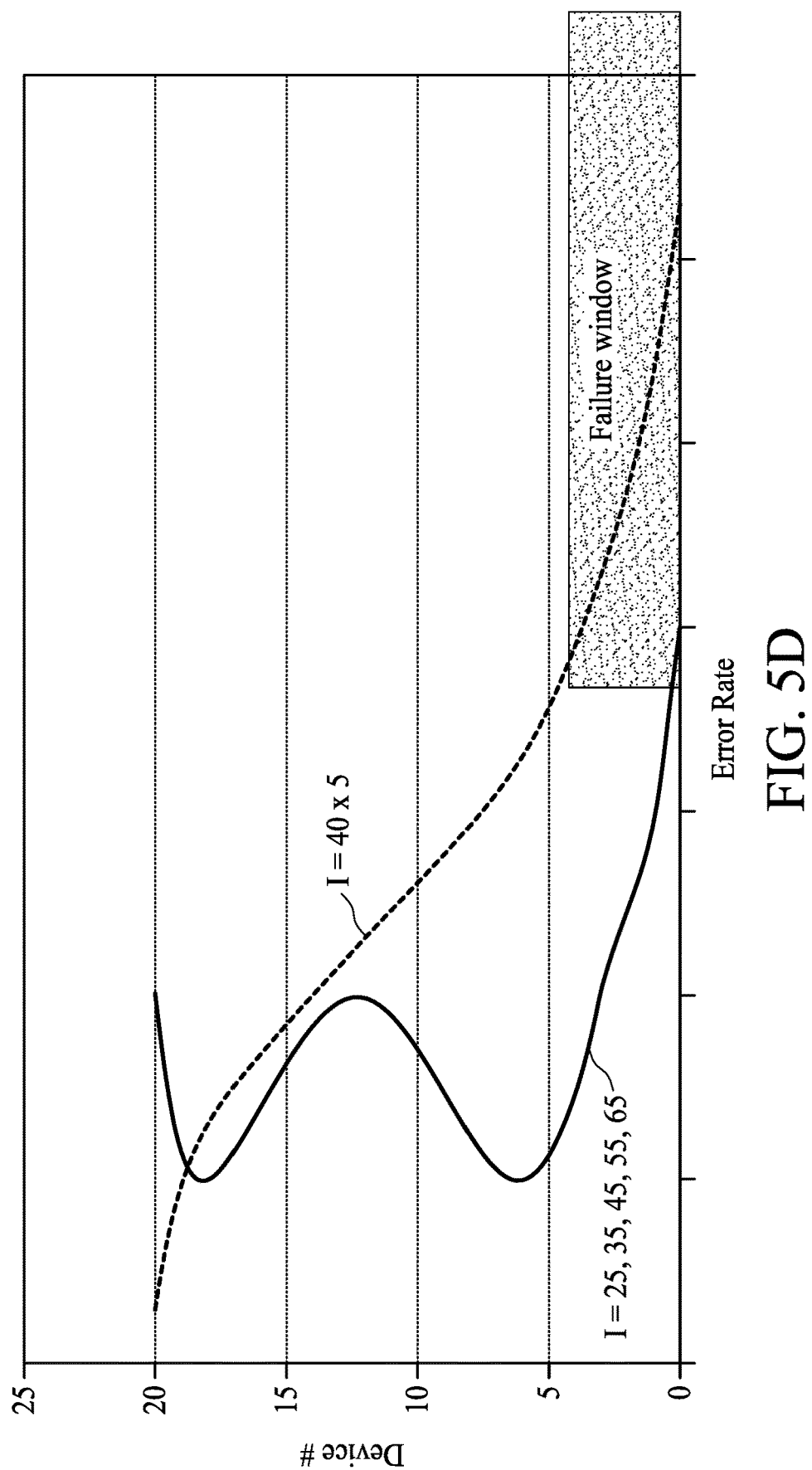
FIG. 5D compares the error rate of an array of magnetic random access memory cells of multiple application of write current at a constant write current and hopping write currents.

In embodiments of the present disclosure, multiple different write currents are applied to a given MRAM cell in a hopping scheme. As shown in FIG. 5C, where the Y-axis is a logarithmic scale and the X-axis is in units of the error rate is reduced by two orders of magnitude using the write-current hopping scheme compared to merely repeating the application of the same write current when the magnetic orientation of the MRAM is not changed. FIG. 5D compares the error rate of magnetic random access memory cells having multiple applications of write current at a constant write current and hopping write currents where the current (I) is in units of μA. The hopping scheme will be explained in more detail with respect to FIG. 6.

The write current set by the first step of the function test is the population-averaged Iopt. Within the cell population, there are MRAM cells whose Iopt are significantly different from this population average. These cells will have a high error rate when written with current set this way.

In embodiments of the present disclosure, a write process with multiple applications of the write current using a set of varying currents is used. This set of write currents will be centered on the population-averaged value set in the first step and covering a variation range. This variation range can be determined and set based on the error rate analysis of the population in the second step of the functional test. The multiple shots will hop through a search pattern in the range. The multiple-shot "hopping" scheme so determined is used in the write process in field operation of the array of MRAM cells.

Figure 6:
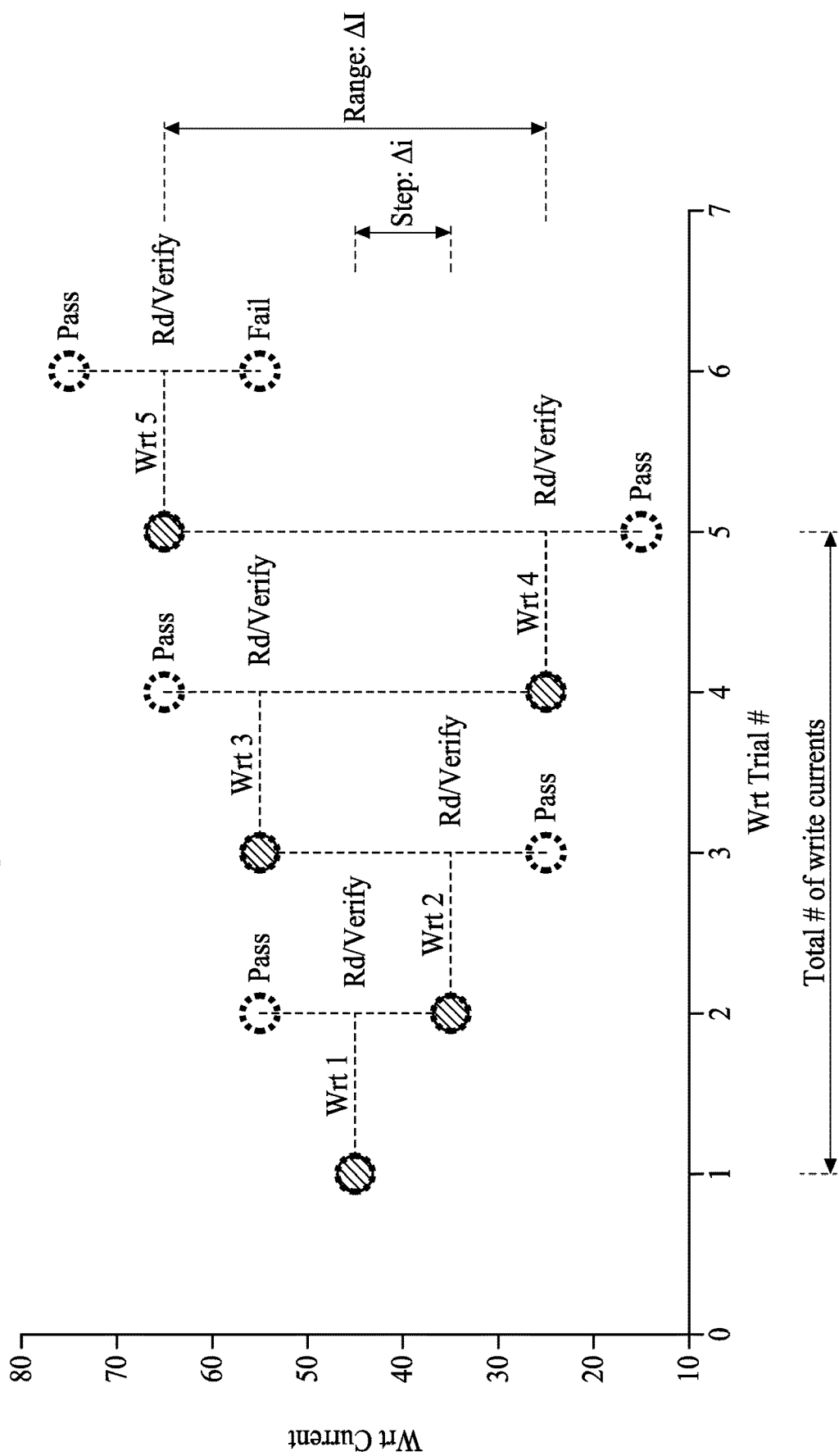
FIG. 6 illustrates a hopping-write current iterative process according to an embodiment of the disclosure.

A write process with multiple applications of write current uses a set of varying write currents in embodiments of the disclosure. The multiple write current applications hop through a search pattern as shown in FIG. 6. Fewer devices will fail using the hopping write scheme. In the hopping write scheme, the set of currents will be centered around the population-averaged value set in the first step and covering a variation range. This variation range/step can be determined and set based on an "Iopt" analysis of the population in the second step of the functional test.

FIG. 6 illustrates a hopping-write current iterative process according to an embodiment of the disclosure. Step Δi indicates a difference in write current in μA for a given write operation, while ΔI indicates the total range in μA between the values of the highest and the lowest write currents. In this embodiment, the first write current Wrt 1 is the optimum write current for the array. The optimum write current for the array was previously determined during functional testing of the MRAM array. After applying the optimum write current Wrt 1, a read current is applied to determine whether the magnetic orientation of the MRAM cell has changed. The read current is fixed in some embodiments. The read current is determined during the functional testing. In some embodiments, a fixed read current is set for die, block, or array, depending on different design schemes.

If the magnetic orientation has changed as a result of the application of the optimum write current, the MRAM cell passes (Pass) and is good. If the magnetic orientation of the MRAM cell has not changed, then a second write current Wrt 2 is applied. The value of the second write current Wrt 2 is different from the optimum write current Wrt 1. In some embodiments, the second write current Wrt 2 is less than the optimum write current Wrt 1, in other embodiments, the second write current Wrt 2 is greater than the optimum write current Wrt 1. After applying the second write current Wrt 2, a read current is applied to determine whether the magnetic orientation of the MRAM cell has changed. If the magnetic orientation has changed as a result of the application of the second write current Wrt 2, the MRAM cell is good. If the magnetic orientation of the MRAM cell has not changed, then a third write current Wrt 3 is applied. The value of the third write current Wrt 3 is different from the optimum write current Wrt 1 and the second write current Wrt 2. The third write current Wrt 3 is either less than or greater than the optimum write current Wrt 1 depending on the second write current Wrt 2. The third write current Wrt 3 is the opposite of second write current Wrt 2 in that if the second write current Wrt 2 is less than the optimum write current Wrt 1 the third write current Wrt 3 is greater than the optimum write current Wrt 1 and if the second write current Wrt 2 is greater than the optimum write current Wrt 1 the third write current Wrt 3 is less than the optimum write current Wrt 1. In some embodiments the magnitude Δi of the difference between the second write current Wrt 2 and the optimum write current Wrt 1 is the same as the magnitude Δi of the difference of the between the third write current Wrt 3 and the optimum write current Wrt 1.

After applying the third write current Wrt 3, a read current is applied to determine whether the magnetic orientation of the MRAM cell has changed. If the magnetic orientation has changed as a result of the application of the third write current Wrt 3, the MRAM cell is good. If the magnetic orientation of the MRAM cell has not changed, then a fourth write current Wrt 4 is applied. The value of the fourth write current Wrt 4 is different from the optimum write current Wrt 1, the second write current Wrt 2, and the third write current Wrt 3. The fourth write current Wrt 4 is either less than or greater than the optimum write current Wrt 1 depending on the third write current Wrt 3. The fourth write current Wrt 4 is the opposite of third write current Wrt 3 in that if the third write current Wrt 3 is less than the optimum write current Wrt 1 the fourth write current Wrt 4 is greater than the optimum write current Wrt 1 and if the third write current Wrt 3 is greater than the optimum write current Wrt 1 the fourth write current Wrt 4 is less than the optimum write current Wrt 1. The magnitude 2Δi of the difference between the fourth write current Wrt 4 and the optimum write current Wrt 1 is greater than magnitude Δi of the difference between the third write current Wrt 3 and the optimum write current Wrt 1 and the difference Δi between the second write current Wrt 2 and the optimum write current Wrt 1.

After applying the fourth write current Wrt 4, a read current is applied to determine whether the magnetic orientation of the MRAM cell has changed. If the magnetic orientation has changed as a result of the application of the fourth write current Wrt 4, the MRAM cell is good. If the magnetic orientation of the MRAM cell has not changed, then a fifth write current Wrt 5 is applied. The value of the fifth write current Wrt 5 is different from the optimum write current Wrt 1, the second write current Wrt 2, the third write current Wrt 3, and the fourth write current Wrt 4. The fifth write current Wrt 5 is either less than or greater than the optimum write current Wrt 1 depending on the fourth write current Wrt 4. The fifth write current Wrt 5 is the opposite of fourth write current Wrt 4 in that if the fourth write current Wrt 4 is less than the optimum write Wrt 1 current the fifth write current Wrt 5 is greater than the optimum write current Wrt 1 and if the fourth write current Wrt 4 is greater than the optimum write current Wrt 1 the fifth write current Wrt 5 is less than the optimum write current Wrt 1. The magnitude 2Δi of the difference between the fifth write current Wrt 5 and the optimum write current Wrt 1 is greater than magnitude Δi of the difference between the third write current Wrt 3 and the optimum write Wrt 1 current and the difference Δi between the second write current Wrt 2 and the optimum write current Wrt 1. In some embodiments the magnitude 2Δi of the difference between the fifth write current Wrt 5 and the optimum write current Wrt 1 is the same as the magnitude 2Δi of the difference between the fourth write current Wrt 4 and the optimum write current Wrt 1.

After applying the fifth write current Wrt 5, a read current is applied to determine whether the magnetic orientation of the MRAM cell has changed. If the magnetic orientation has changed as a result of the application of the fifth write current Wrt 5, the MRAM cell is good. If the magnetic orientation of the MRAM cell has not changed, then the MRAM cell is rejected. In this embodiment, five iterations of write current are applied to determine whether the MRAM cell is good or a reject. In some embodiments, difference in the fourth write current Wrt 4 and the fifth write current Wrt 5 is the total range in the magnitude ΔI of the write currents applied to the MRAM cell.

As shown in FIG. 6, the hopping scheme is centered around the MRAM array Iopt write current Wrt 1, alternating between write currents having a magnitude less than and greater than Iopt write current. Methods according to this disclosure are not limited to five iterations to determine whether an MRAM is acceptable. In other embodiments, three or four iterations of applying the write current are applied. In other embodiments, more than five iterations of applying the write currents are applied.

Figure 7:
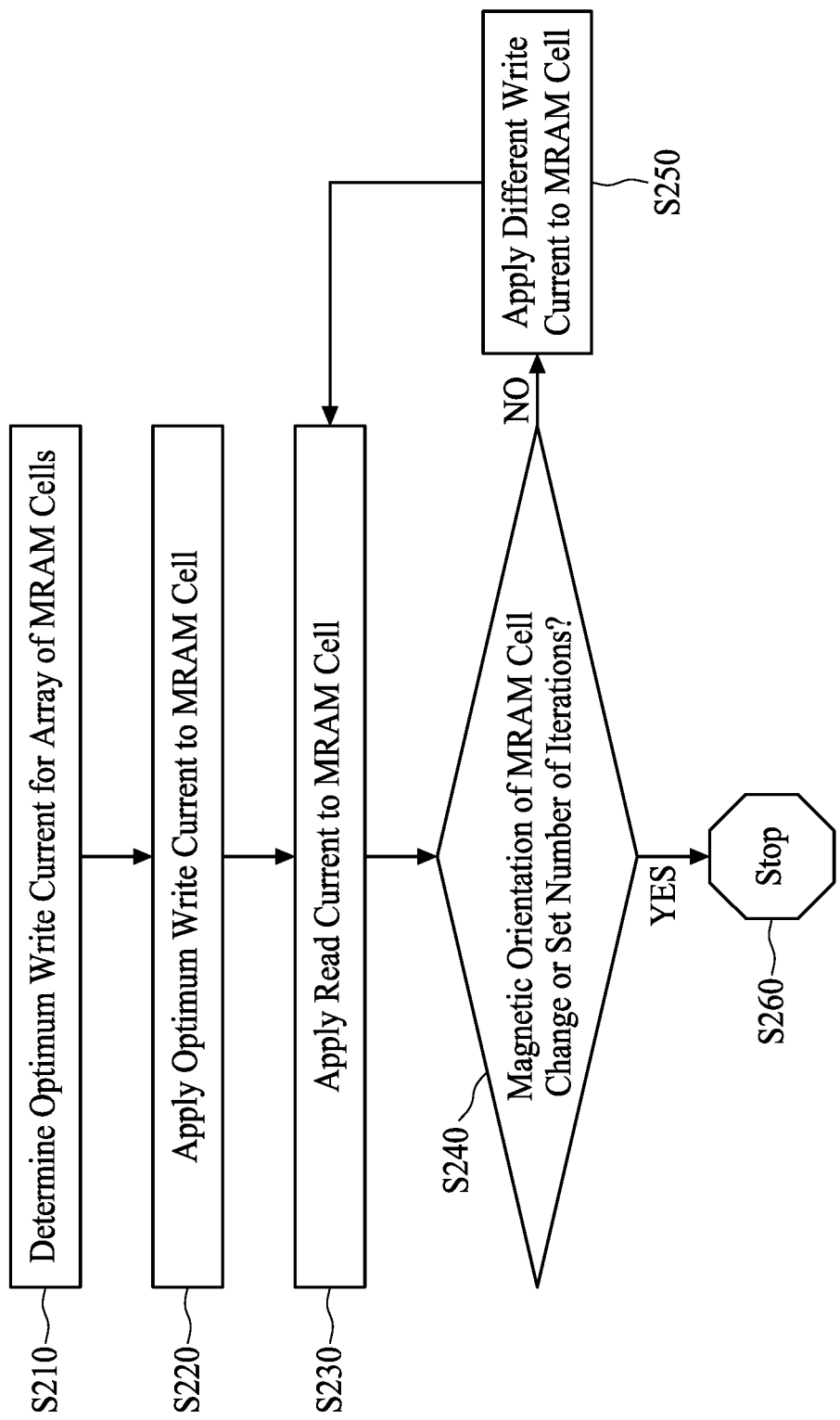
FIG. 7 is a flowchart illustrating a method of writing to an MRAM cell according to embodiments of the disclosure.

FIG. 7 is a flowchart illustrating a method 200 of writing to an MRAM cell according to an embodiment of the present disclosure. In operation S210, an optimum write current for an array of MRAM cells is determined. The optimum write current is applied to an MRAM cell in operation S220. Next, a read current is applied to the MRAM cell in S230. Whether the magnetic orientation of the MRAM cell has changed is determined in operation S240. If the magnetic orientation has not changed, then a different write current is applied to the MRAM cell in operation S250 and the application of the read current is repeated, as shown in FIG. 7. If the magnetic orientation has not changed, the application of different values of write current is repeated until either the magnetic orientation changes or a set number of iterations of applying different write currents is obtained. When either the magnetic orientation has changed or a set number of iterations of applying different write currents is obtained, the application of write current is stopped in operation S260.

In some embodiments, the method 200 includes iteratively repeating the application of write current in operation S250 and read current in operation S230 if the magnetic orientation of the first magnetic random access memory cell has not changed, wherein the iterative application of write current and read current is stopped if the magnetic orientation of the first magnetic random access memory cell has changed, and wherein the write current at each application of the write current is different than any other write current. In some embodiments, each iteration of application of write current alternates between greater than and less than the optimum write current.

In some embodiments, each successive write current that is less than the optimum write current is less than a preceding write current that is less than the optimum write current, and each successive write current that is greater than the optimum write current is greater than a preceding write current that is greater than the optimum write current. For example, as shown in FIG. 6, in an embodiment, the Iopt for an array of MRAM cells is determined to be 45 μA. If the magnetic orientation of the MRAM cell does not change after applying a write current of 45 μA, a write current of 35 μA is applied. If the magnetic orientation of the MRAM cell does not change after applying the write current of 35 μA a third write current of 55 μA is applied If the magnetic orientation of the MRAM cell does not change after applying the third write current of 55 µA a fourth write current of 25 µA is applied. If the magnetic orientation of the MRAM cell does not change after applying the fourth write current of 25 µA a fifth write current of 65 µA is applied. In this embodiment, if five iterations is not sufficient to change the magnetic orientation, the MRAM cell is rejected. In this embodiment, the step of Δi of each iteration from the Iopt is 10 µA, and the overall range ΔI of write currents applied to the MRAM cell from the lowest write current value to highest write current value is 40 µA. As shown in FIG. 6, in some embodiments, write currents applied after the application of the optimum write current alternate between write currents that are less than the optimum write current and greater than the optimum write current. In an embodiment, the optimum write current is at a midpoint of values of all the alternating write currents.

Figure 8:
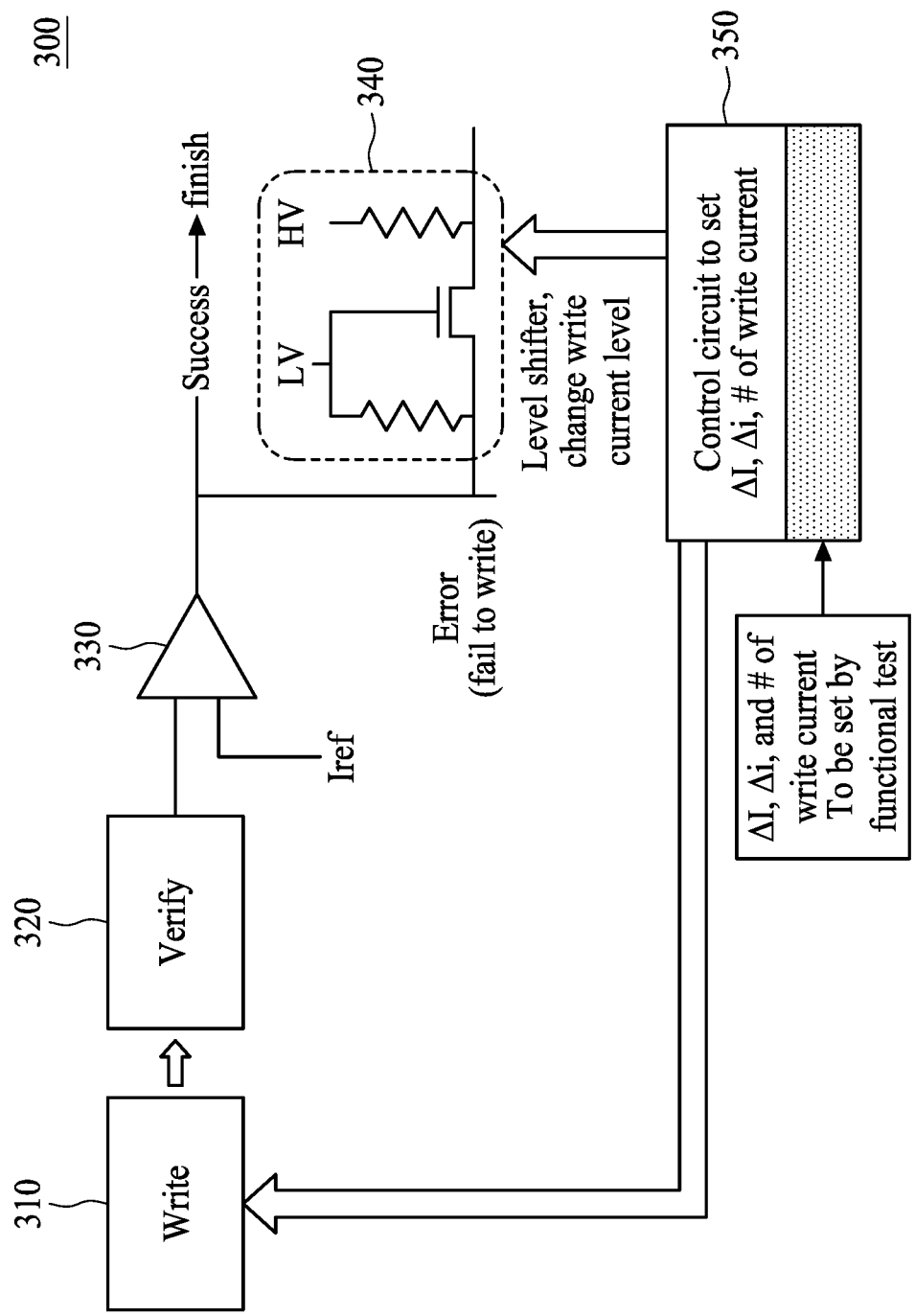
FIG. 8 illustrates a circuit for a hopping-write scheme according to an embodiment of the disclosure.

FIG. 8 illustrates a portion of a circuit 300 for performing the hopping-write scheme according to an embodiment of the disclosure. The Iopt for the chip, array, module, or block of MRAM cells is determined during the functional test of the chip, array, module, or block of MRAM cells in some embodiments. A Gaussian-type distribution of Iopt is determined by the functional test in some embodiments. A current source 310 applies a write current to the array of MRAM cells, a block of MRAM cells, or an MRAM cell. A current source 320 applies a read current to verify whether the MRAM cell(s) changed magnetic orientation. In some embodiments, the same current source applies both the write current and the read current. A comparator or sense amplifier 330 is included in the circuit 300 in some embodiments. If the magnetic orientation changes, the write process is stopped. If the magnetic orientation of the MRAM cell does not change (fails to write), a level shifter 340 changes the current level. A controller 350 controls the current sources 310, 320 and the level shifter 340. In some embodiments, the Iopt, the magnitude of the current step Δi for each iteration of changing the write current, the total range of current change ΔI for all the iterations, and the number of iterations are determined during the functional test of the array, and the controller sets these values in the circuit 300.

Figure 9:
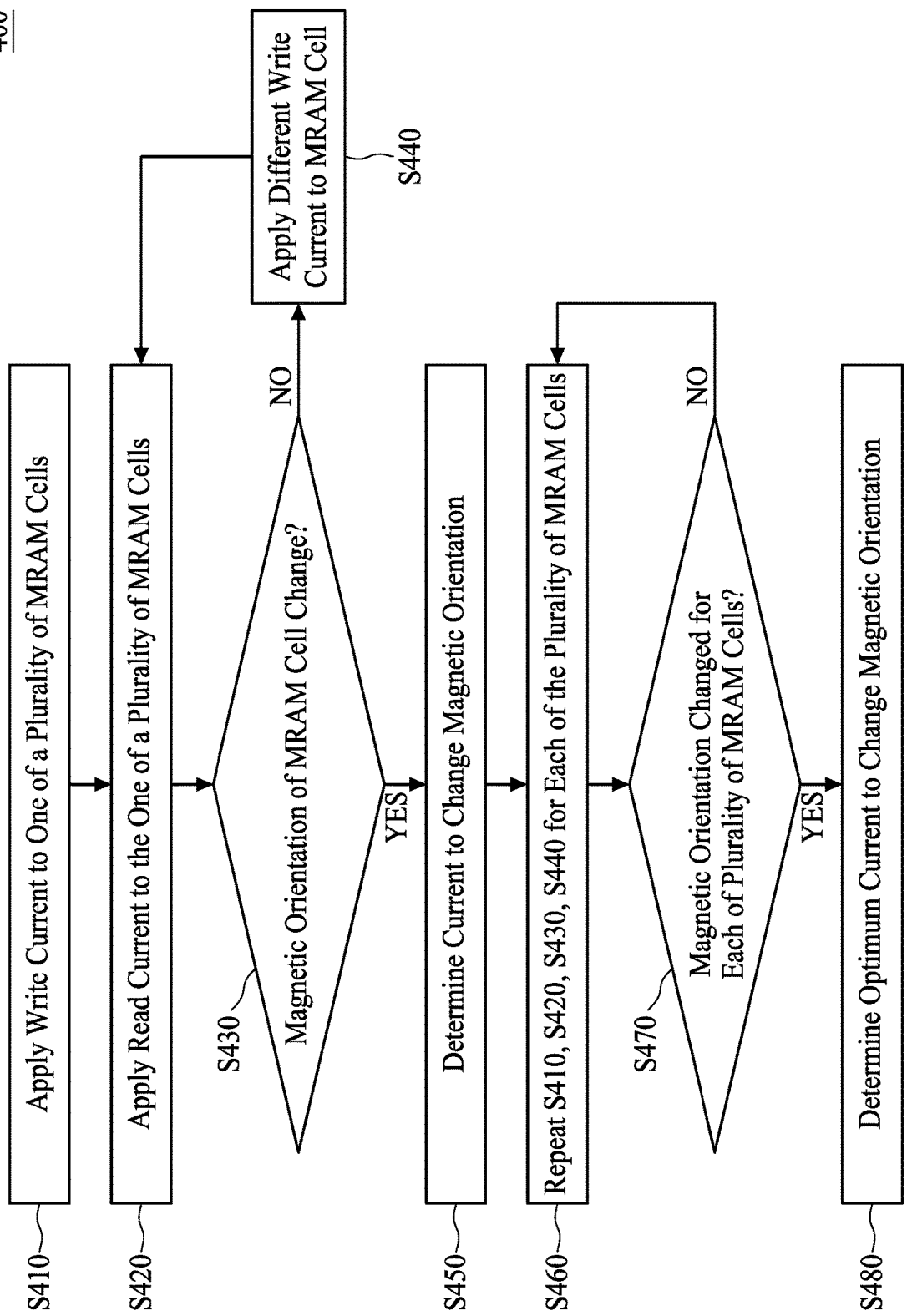
FIG. 9 is a flowchart illustrating a method of determining an optimum write current for an array of MRAM cells according to an embodiment of the present disclosure.

FIG. 9 is a flowchart illustrating a method 400 of determining an optimum write current for an array of MRAM cells according to an embodiment of the present disclosure. In operation S410, a write current is applied to one of a plurality of MRAM cells. Next, a read current is applied to the MRAM cell in S420. Whether the magnetic orientation of the MRAM cell has changed is determined in operation S430. If the magnetic orientation has not changed then a different write current is applied to the MRAM cell in operation S440 and the application of the read current is repeated, as shown in FIG. 9. If the magnetic orientation has not changed, the application of different values of write current is repeated until the magnetic orientation changes. When the magnetic orientation has changed, the value of write current that caused the change of magnetic orientation of the MRAM cell is determined in S450. Then the steps of applying the write current S410, applying the read current S420, determining whether the magnetic orientation of the MRAM cell has changed S430, and if the magnetic orientation of the MRAM cell has not changed applying a different write current to the MRAM cell S440 are repeated in S460. Next, whether the magnetic orientation of each of the plurality of MRAM cells has changed is determined in S470. If not all of the plurality of MRAM cells has changed its magnetic orientation, the step of applying a different write current is repeated. The initial write current applied is a write current at the low end of the predicted range of suitable write currents. If the initial write current does not cause the magnetic orientation to change, the magnitudes of subsequent applied write currents are increased in a stepwise manner until the magnetic orientation of the MRAM cell is changed. If the magnetic orientation of each of the plurality of MRAM cells has changed, the optimum write current is determined in S480 based on the write currents to change the magnetic orientation of each of the plurality of MRAM cells. In some embodiments, the optimum write current is the average of the write currents to change the magnetic orientation of each of the plurality of MRAM cells.

Figure 10:
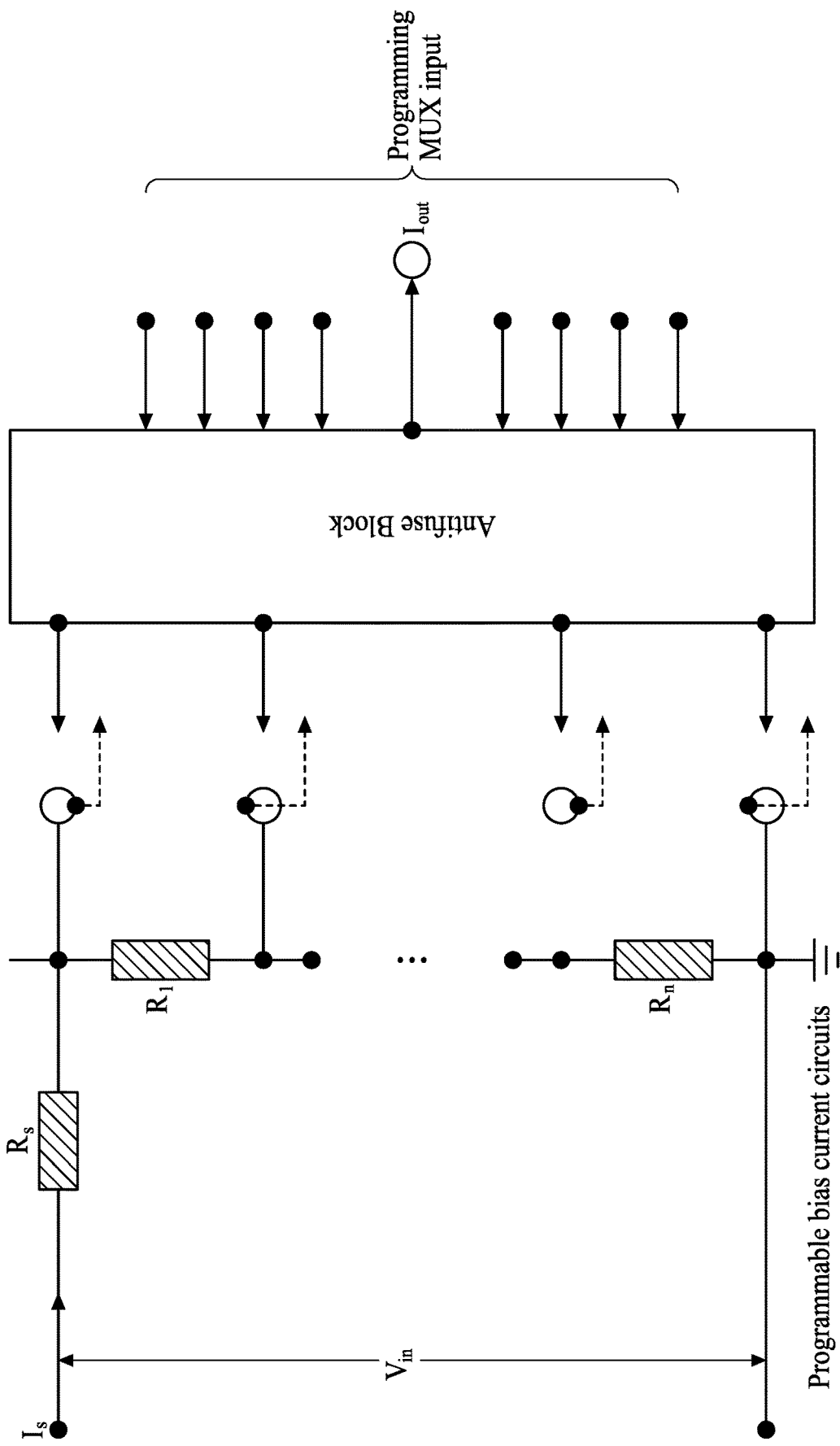
FIG. 10 shows a programmable circuit for setting the step of the iterative write current change and the range of write current according to an embodiment of the disclosure.

In some embodiments, the parameters determined during the functional test, including the the Iopt, the magnitude of the current step Δi for each iteration of changing the write current, the total range of current change ΔI for all the iterations, and the number of iterations are burned into the MRAM array circuit by burning fuse or antifuses in the circuit. The burn-in permanently sets the parameters. The parameters are different for each block in an array of MRAM cells in some embodiments. Thus, each block in an array of MRAM cells can be optimized. For example, FIG. 10 shows an antifuse block in conjunction with programmable circuits for setting the step of the iterative write current change and the range of write current according to an embodiment of the disclosure. As shown in FIG. 10, a programming multiplexer input burns the appropriate antifuses in the antifuse block to set the parameters of the MRAM array circuit. For example, the Iopt of the chip, array, module, or block of MRAM cells is burned-in after the functional test determines Iopt for the chip, array, module, or block of MRAM cells. The functional test and burn-in may be performed on any size grouping of MRAM cells.

Figure 11:
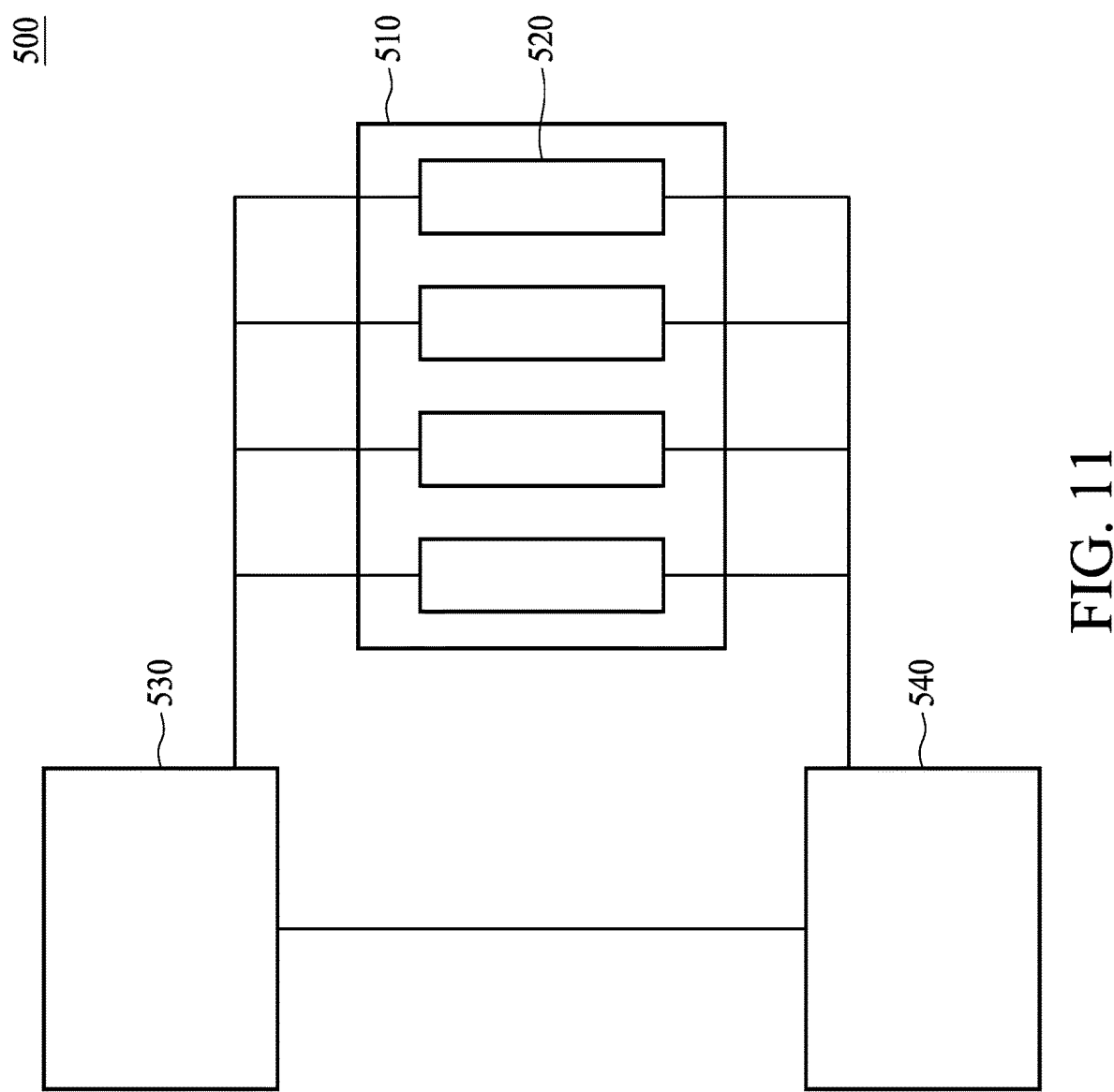
FIG. 11 shows a functional test circuit according to an embodiment of the disclosure.

FIG. 11 shows a circuit, such as a functional test circuit 500, according to some embodiments of the disclosure. The functional test circuit 500 includes an array 510 including a plurality of blocks 520. Each block 520 includes a plurality of magnetic random access memory cells. The functional test circuit 500 includes a current source 530 configured to provide a plurality of different write currents and a read current to each of the magnetic random access memory cells in the blocks 520 of the array 510. The functional test circuit 500 according to some embodiments, also includes a controller 540 configured to control the application of different write currents from the current source 530 to each of the magnetic random access memory cells in each block 520 and determine whether the magnetic orientation of each of the magnetic random access memory cells has changed in response to each application of the write current. The controller 540 is further configured to control the current source 530 so that each application of write current alternates between greater than and less than a first write current applied to each of the magnetic random access memory cells, to stop the application of the write current to each magnetic random access memory cell when it is determined that the magnetic orientation of each magnetic random access memory cell has changed, and to determine an average of the values of the write currents that cause the magnetic orientation to change for the magnetic random access memory cells in each block 520 of the array 510.

In some embodiments, the controller 540 is configured to set the Iopt, the magnitude of the current step Δi for each iteration of changing the write current, the total range of current change ΔI for all the iterations, and the number of iterations in the circuit 500. In some embodiments, the controller 540 is configured to isolate certain MRAM cells and blocks 520 in the array by burning fuses or antifuses.

Using the zigzag hopping write pattern of the present disclosure, the time used to a successful write will be shorter. In addition, fewer devices will fail with this new "hopping" write scheme. In some embodiments, a two orders of magnitude reduction of failing MRAM cells is obtained by using the hopping write scheme of the present disclosure. In some embodiments, the failure rate of the MRAM cells is reduced to $1 \times 10^{-6}$ or less using the hopping write scheme of the present disclosure. Thus, the present disclosure provides increased yield of semiconductor devices.

An embodiment of the disclosure is a method of manufacturing an array of magnetic random access memory cells, including writing to a magnetic random access memory cell. The writing to a magnetic random access memory cell includes determining an optimum write current for the array of magnetic random access memory cells, and applying the optimum write current to a first magnetic random access memory cell in the array. A first read current is applied to the first magnetic random access memory cell to determine whether a magnetic orientation of the first magnetic random access memory cell has changed in response to the applying the optimum write current. A second write current is applied to the first magnetic random access memory cell when the magnetic orientation of the first magnetic random access memory cell has not changed. The second write current is different from the optimum write current. A second read current is applied to the first magnetic random access memory cell to determine whether the magnetic orientation of the first magnetic random access memory cell has changed in response to the applying the second write current. In an embodiment, the method includes applying a third write current to the first magnetic random access memory cell when the magnetic orientation of the first magnetic random access memory cell has not changed after application of the second write current, wherein the third write current is different from the optimum write current and the second write current, and applying a third read current to the first magnetic random access memory cell to determine whether the magnetic orientation of the first magnetic random access memory cell has changed in response to the applying the third write current. In an embodiment, the second write current is greater than the optimum write current and the third write current is less than the optimum write current. In an embodiment, the second write current is less than the optimum write current and the third write current is greater than the optimum write current. In an embodiment, the method includes iteratively repeating application of a write current and a read current when the magnetic orientation of the first magnetic random access memory cell has not changed, wherein the iterative application of the write current and the read current is stopped when the magnetic orientation of the first magnetic random access memory cell has changed, and wherein the write current at each application of the write current is different from any other write current. In an embodiment, each iteration of application of write current alternates between greater than and less than the optimum write current. In an embodiment, each successive write current that is less than the optimum write current is less than a preceding write current that is less than the optimum write current, and each successive write current that is greater than the optimum write current is greater than a preceding write current that is greater than the optimum write current. In an embodiment, write currents applied after the application of the optimum write current alternate between write currents that are less than the optimum write current and write currents that are greater than the optimum write current. In an embodiment, the optimum write current is at a midpoint of values of all the alternating write currents.

Another embodiment of the disclosure is a method of manufacturing an array of magnetic random access memory cells, including determining an optimum write current for the array of magnetic random access memory cells. Determining the optimum write current includes (a) applying a first write current to one of a plurality of magnetic random access memory cells in the array of magnetic random access memory cells, and (b) applying a first read current to the one of a plurality of magnetic random access memory cells to determine whether a magnetic orientation of the one of a plurality of magnetic random access memory cells has changed in response to the applying the write current. In operation (c) a second write current is applied to the one of a plurality of magnetic random access memory cells when that the magnetic orientation of the one of a plurality of magnetic random access memory cells has not changed, wherein the second write current is different from the optimum write current. Then in operation (d) a second read current is applied to the one of a plurality of magnetic random access memory cells to determine whether the magnetic orientation of the one of a plurality of magnetic random access memory cells has changed in response to the applying the second write current, wherein the second read current has a same value as the first read current. Next, a third write current is applied to the one of a plurality of magnetic random access memory cells when the magnetic orientation of the one of a plurality of magnetic random access memory cells has not changed after application of the second write current, wherein the third write current is different from the optimum write current and the second write current in operation (e). In operation (f) a third read current is applied to the one of the plurality of magnetic random access memory cells to determine whether the magnetic orientation of the one of a plurality of magnetic random access memory cells has changed in response to the applying the third write current, wherein the third read current has a same value as the first and second read currents. Then, in operation (g) application of write current and read current is iteratively applied when the magnetic orientation of the one of the plurality of magnetic random access memory cells has not changed, wherein the iteratively repeating application of write current and read current is stopped when the magnetic orientation of the one of a plurality of magnetic random access memory cells has changed, wherein the write current at each application of the write current is different from any other write current, and wherein the first write current has a first magnitude and magnitudes of subsequent applications of write currents are increased in a stepwise manner. Subsequently, in operation (h) a value of the write current that caused the magnetic orientation of the magnetic random access memory cell to change is determined. Operations (a) through (h) are repeated for each of the plurality of magnetic random access memory cells in the array of magnetic random access memory cells in operation (i). The optimum write current is determined based on the write currents determined for each of the plurality of magnetic random access memory cells in operation (j). In an embodiment, the optimum write current is an average of the write currents that caused the magnetic orientations of the magnetic random access memory cells to change for each the plurality of magnetic random access memory cells. In an embodiment, the method includes writing to a magnetic random access memory cell in the array of magnetic random access memory cells, wherein the writing to the magnetic random access memory cell includes: applying the optimum write current to a selected magnetic random access memory cell in the array, applying a cell writing read current to the selected magnetic random access memory cell to determine whether the magnetic orientation of the selected magnetic random access memory cell has changed in response to the applying the optimum write current, applying a cell writing write current to the selected magnetic random access memory cell when the magnetic orientation of the selected magnetic random access memory cell has not changed in response to the applying the optimum write current, and iteratively repeating application of the cell writing write current and cell writing read current when the magnetic orientation of the selected magnetic random access memory cell has not changed. The iterative application of the cell writing write current and the cell writing read current is stopped when the magnetic orientation of the selected magnetic random access memory cell has changed, and the cell writing write current at each application of the cell writing write current is different from any other cell writing write current. Then, the selected magnetic random access memory cell is isolated if the magnetic orientation of the selected magnetic random access memory cell does not change after a set number of iterations of applying the cell writing write current. In an embodiment, the selected magnetic random access memory cell is isolated by burning a fuse or antifuse. In an embodiment, a magnitude of a first application of the cell writing write current is greater than a magnitude of the optimum write current and a magnitude of a second application of the cell writing write current is less than the magnitude of the optimum write current. In an embodiment, a magnitude of a first application of the cell writing write current is less than the optimum write current and a magnitude of a second application of a second cell writing write current is greater than the magnitude of the optimum write current. In an embodiment, magnitudes of each iteration of application of cell writing write current alternates between greater than and less than the optimum write current. In an embodiment, cell writing write currents applied after application of the optimum write current alternate between a cell writing write current that is less than the optimum write current and a cell writing write current that is greater than the optimum write current. In an embodiment, cell writing write currents applied after application of the optimum write current alternate between a cell writing write current that is less than the optimum write current and a cell writing write current that is greater than the optimum write current, each successive cell-writing write current that is less than the optimum write current is less than a preceding cell-writing write current that is less than the optimum write current, and each successive cell-writing write current that is greater than the optimum write current is greater than a preceding cell-writing write current that is greater than the optimum write current.

Another embodiment of the disclosure is a method of writing to a magnetic random access memory cell, including applying a first write current to a first magnetic random access memory cell. Whether the magnetic orientation of the first magnetic random access memory cell has changed in response to the applying the first write current is determined. A second write current is applied to the first magnetic random access memory cell after it is confirmed that the magnetic orientation of the first magnetic random access memory cell has not changed, wherein the second write current is different from the first write current. Whether the magnetic orientation of the first magnetic random access memory cell has changed in response to the applying the second write current is determined. A third write current is applied to the first magnetic random access memory cell after it is confirmed that the magnetic orientation of the first magnetic random access memory cell has not changed after application of the second write current, wherein the third write current is different from the first write current and the second write current. Whether the magnetic orientation of the first magnetic random access memory cell has changed is determined in response to the applying the third write current. In an embodiment, the method includes repeating the application of the write current until the magnetic orientation of the first magnetic random access memory cell has changed or a certain number of applications of write current is achieved, wherein a value of the write current applied during each application of write current is different.

Another embodiment of the disclosure is a method of writing to a magnetic random access memory cell, including iteratively applying write currents to a first magnetic random access memory cell and determining whether the magnetic orientation of the first magnetic random access memory cell has changed in response to each application of the write current. A value of the write current applied during each application of the write current is different. Each iteration of the application of the write current alternates between greater than and less than a first write current applied to the first magnetic random access memory cell. The iterative application of the write current is stopped when it is determined that the magnetic orientation of the first magnetic random access memory cell has changed.

Another embodiment of the disclosure is a method of writing to a plurality of magnetic random access memory cells in an array of magnetic random access memory cells, including iteratively applying write currents to a first magnetic random access memory cell in the array and determining whether the magnetic orientation of the first magnetic random access memory cell has changed in response to each application of the write current. A value of the write current applied during each application of write current is different. Each iteration of application of the write current alternates between greater than and less than a first write current applied to the first magnetic random access memory cell. The iterative application of the write current is stopped when it is determined that the magnetic orientation of the first magnetic random access memory cell has changed or a set number of applications of write current to the first magnetic random access memory cell is performed. Write currents are iteratively applied to a second magnetic random access memory cell in the array and whether the magnetic orientation of the second magnetic random access memory cell has changed in response to each application of the write current is determined. A value of the write current applied during each application of the write current is different. Each iteration of the application of the write current alternates between greater than and less than a first write current applied to the second magnetic random access memory cell. The iterative application of the write current is stopped when it is determined that the magnetic orientation of the second magnetic random access memory cell has changed or a set number of applications of the write current to the second magnetic random access memory cell is performed.

Another embodiment of the disclosure is a method including applying a first write current to a first magnetic random access memory cell in a first block of magnetic random access memory cells in an array of magnetic random access memory cells. Whether the magnetic orientation of the first magnetic random access memory cell has changed in response to the applying the first write current is determined. A second write current is applied to the first magnetic random access memory cell if the magnetic orientation of the first magnetic random access memory cell has not changed, wherein the second write current is different from the first write current. Whether the magnetic orientation of the first magnetic random access memory cell has changed in response to the applying the second write current is determined. A third write current is applied to the first magnetic random access memory cell if the magnetic orientation of the first magnetic random access memory cell has not changed after the application of the second write current, wherein the third write current is different from the first write current and the second write current. Whether the magnetic orientation of the first magnetic random access memory cell has changed in response to the applying the third write current is determined. The application of the write current is repeated until the magnetic orientation of the first magnetic random access memory cell has changed or a certain number of applications of write current is achieved, wherein a value of the write current applied during each application of write current is different. The value of the write current that causes the magnetic orientation of the first magnetic random access memory cell is determined. The applying the first write current is repeated to each of a plurality of magnetic random access memory cells in the first block of magnetic random access memory cells in the array of magnetic random access memory cells. The determination of whether the magnetic orientation of each of the plurality of magnetic random access memory cell has changed in response to the applying the first write current is repeated for each of the plurality of magnetic random access memory cells in the first block of magnetic random access memory cells. The applying of the second write current is repeated for each of the plurality of magnetic random access memory cells in the first block in which the magnetic orientation has not changed, wherein the second write current is different from the first write current. The determination of whether the magnetic orientation of each magnetic random access memory cell has changed in response to the applying the second write current is repeated for each magnetic random access memory cell to which the second write current is applied. The applying of the third write current to each of the plurality of magnetic random access memory cells in the first block in which the magnetic orientation has not changed after the application of the second write current is repeated, wherein the third write current is different from the first write current and the second write current. The determination of whether the magnetic orientation of each of the plurality of the magnetic random access memory cells has changed in response to the applying the third write current is repeated for each of the plurality of magnetic random access memory cell to which the third write current is applied. The application of write current is repeated until the magnetic orientation of each of the magnetic random access memory cells has changed or a certain number of applications of the write current is achieved. The value of the write current applied during each application of write current to a specific magnetic random access memory cell is different. The value of the write current that causes the magnetic orientation of each of magnetic random access memory cells in the first block is determined. An average of the values of the write currents that cause the magnetic orientation to change for the magnetic random access memory cells in the first block is determined. In an embodiment, the average write current for the first block is set for the first block during a burn-in operation of the array. In an embodiment, the array includes a plurality of blocks of magnetic random access memory cells. In an embodiment, the method is repeated for each block of magnetic random access memory cells in the array. In an embodiment, each of blocks of magnetic random access memory cells of the plurality of blocks of magnetic random access memory cells have different average write currents. In an embodiment, magnetic random access memory cells that do not change magnetic orientation after a set number of application of write currents are isolated from the respective block of magnetic random access memory cells by burning a fuse or anti-fuse. In some embodiments, blocks of random access memory cells that include greater than a set number of isolated random access memory cells are isolated from the array by burning a fuse or anti-fuse.

Another embodiment of the disclosure is a circuit including a current source configured to apply a plurality of different write currents and a read current to magnetic random access memory cells in an array of magnetic random access memory cells. The circuit includes a controller configured to determine an optimum write current for the array of magnetic random access memory cells, determine whether the magnetic orientation of the magnetic random access memory cells have changed in response to the applying the different write currents, and control the application of the write current from the current source to the magnetic random access memory cells.

Another embodiment of the disclosure is a circuit including a current source configured to provide a plurality of different write currents to a magnetic random access memory cell. The circuit includes a controller configured to control the iterative application of the write currents from the current source to the magnetic random access memory cell and determine whether the magnetic orientation of the magnetic random access memory cell has changed in response to each application of the write current. The controller is further configured to control the current source so that each application of the write current alternates between greater than and less than a first write current applied to the magnetic random access memory cell, and to stop the application of write current when it is determined that the magnetic orientation of the first magnetic random access memory cell has changed.

Another embodiment of the disclosure is a functional test circuit including an array including a plurality of blocks, each block including a plurality of magnetic random access memory cells. The circuit includes a current source configured to provide a plurality of different write currents and a read current to each of the magnetic random access memory cells. The circuit includes a controller configured to control the application of different write currents from the current source to each of the magnetic random access memory cells and determine whether the magnetic orientation of each of the magnetic random access memory cells has changed in response to each application of the write current. The controller is further configured to control the current source so that each application of write current alternates between greater than and less than a first write current applied to each of the magnetic random access memory cells, to stop the application of the write current to each magnetic random access memory cell when it is determined that the magnetic orientation of each magnetic random access memory cell has changed, and to determine an average of the values of the write currents that cause the magnetic orientation to change for the magnetic random access memory cells in each block of the array.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a current source configured to apply a plurality of different write currents and a read current to magnetic random access memory cells in an array of magnetic random access memory cells; and
a controller configured to:
determine an optimum write current for the array of magnetic random access memory cells,
determine whether the magnetic orientation of the magnetic random access memory cells have changed in response to the applying the different write currents,
control application of the write current from the current source to the magnetic random access memory cells, and
iteratively change the write current.

2. The circuit of claim 1, further comprising a level shifter configured to change a level of the write current.

3. The circuit of claim 2, further comprising a comparator connected to the current source and the level shifter.

4. The circuit of claim 2, wherein the controller is further configured to control the level shifter.

5. The circuit of claim 1, wherein the controller is further configured to set a magnitude of change of the write current.

6. The circuit of claim 1, wherein the controller is further configured to set a total range of change of the write current.

7. The circuit of claim 1, wherein the controller is further configured to set a total number of iterations of changing the write current.

8. A circuit, comprising:
a current source configured to provide a plurality of different write currents to a magnetic random access memory cell; and
a controller configured to:
control an iterative application of the write currents from the current source to the magnetic random access memory cell,
determine whether the magnetic orientation of the magnetic random access memory cell has changed in response to each application of the write current, and
control the current source so that each application of the write current alternates between greater than and less than a first write current applied to the magnetic random access memory cell, and stop the application of the write current when it is determined that the magnetic orientation of the magnetic random access memory cell has changed.

9. The circuit of claim 8, wherein the current source is further configured to provide a read current to the magnetic random access memory cell.

10. The circuit of claim 8, further comprising a level shifter configured to change a level of the write current.

11. The circuit of claim 10, further comprising a comparator connected to the current source and the level shifter.

12. The circuit of claim 10, wherein the controller is further configured to control the level shifter.

13. The circuit of claim 8, wherein the controller is further configured to set a magnitude of change of the write current.

14. The circuit of claim 8, wherein the controller is further configured to set a total range of change of the write current.

15. The circuit of claim 8, wherein the controller is further configured to set a total number of applications of write current to the magnetic random access memory cell.

16. A functional test circuit, comprising:
an array including a plurality of blocks,
wherein each block includes a plurality of magnetic random access memory cells;
a current source configured to apply a plurality of different write currents and a read current to each of the magnetic random access memory cells; and
a controller configured to:
control the application of different write currents from the current source to each of the magnetic random access memory cells,
determine whether a magnetic orientation of each of the magnetic random access memory cells has changed in response to each application of the write current,
control the current source so that each application of write current alternates between greater than and less than a first write current applied to each of the magnetic random access memory cells,
stop the application of the write current to each magnetic random access memory cell when it is determined that the magnetic orientation of each magnetic random access memory cell has changed, and
determine an average of the values of the write currents that cause the magnetic orientation to change for the magnetic random access memory cells in each block of the array.

17. The circuit of claim 16, wherein the controller is further configured to isolate one or more magnetic random access memory cells or blocks by burning fuses or antifuses in the circuit.

18. The circuit of claim 16, wherein the controller is further configured to set an optimum write current for the array.

19. The circuit of claim 16, wherein the controller is further configured to set a magnitude of change of the write current between each application of the write current.

20. The circuit of claim 16, wherein the controller is further configured to set a total range of current change for all applications of the write current.

* * * * *